United States Patent
Wang (10) Patent No.: US 11,860,204 B2
(45) Date of Patent: Jan. 2, 2024

(54) DISPLAY DEVICE AND DETECTION METHOD FOR IMPEDANCE OF DISPLAY DEVICE

(71) Applicant: TCL CHINA STAR OPTOELECTRONICS TECHNOLOGY CO., LTD., Shenzhen (CN)

(72) Inventor: Fuyi Wang, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 247 days.

(21) Appl. No.: 17/419,722

(22) PCT Filed: Dec. 23, 2020

(86) PCT No.: PCT/CN2020/138475
§ 371 (c)(1),
(2) Date: Jun. 30, 2021

(87) PCT Pub. No.: WO2022/116311
PCT Pub. Date: Jun. 9, 2022

(65) Prior Publication Data
US 2022/0404405 A1    Dec. 22, 2022

(30) Foreign Application Priority Data
Dec. 2, 2020 (CN) .......................... 202011391391.6

(51) Int. Cl.
*G01R 27/02* (2006.01)
*G09F 9/30* (2006.01)
*G09G 3/00* (2006.01)

(52) U.S. Cl.
CPC ............... *G01R 27/02* (2013.01); *G09F 9/30* (2013.01); *G09G 3/006* (2013.01)

(58) Field of Classification Search
CPC ........... G01R 27/00; G01R 27/02; G02F 1/00; G02F 1/01; G02F 1/13; G02F 1/133;
(Continued)

(56) References Cited

U.S. PATENT DOCUMENTS

| | | |
|---|---|---|
| 2003/0201709 A1 | 10/2003 | Mizutani et al. |
| 2006/0169982 A1 | 8/2006 | Shang et al. |

(Continued)

FOREIGN PATENT DOCUMENTS

| | | |
|---|---|---|
| CN | 101089934 A | 12/2007 |
| CN | 102650785 A | 8/2012 |

(Continued)

OTHER PUBLICATIONS

International Search Report in International application No. PCT/CN2020/138475, dated Sep. 6, 2021.
(Continued)

*Primary Examiner* — Hoai-An D. Nguyen
(74) *Attorney, Agent, or Firm* — PV IP PC; Wei Te Chung; Zhigang Ma (57) ABSTRACT

The present invention provides a display device and detection method for impedance of the display device. The display device includes a display panel, a circuit board, and a chip-on-film. The chip-on-film includes pins, and the pins include conducting pins and test pins. The conducting pins are electrically connected to a first detection part of the circuit board, and the test pins are electrically connected to a second detection part of the circuit board. The conducting pins electrically connected to the first detection part are connected to the test pins by test wires.

12 Claims, 3 Drawing Sheets

(58) Field of Classification Search
CPC .. G02F 1/1333; G02F 1/1345; G02F 1/13452; G02F 1/136; G02F 1/1362; G02F 1/136254; G09G 3/00; G09G 3/006; G09G 2300/00; G09G 2300/04; G09G 2300/0421; G09G 2300/0426; G09F 9/00; G09F 9/30
USPC .......................................... 324/600, 649, 650
See application file for complete search history.

(56) References Cited

U.S. PATENT DOCUMENTS

| | | | | |
|---|---|---|---|---|
| 2015/0123933 | A1* | 5/2015 | Jang | G06F 3/04166 345/174 |
| 2017/0196080 | A1* | 7/2017 | Meng | H05K 1/14 |
| 2019/0064239 | A1* | 2/2019 | Lee | G09G 3/006 |
| 2022/0114929 | A1* | 4/2022 | Fu | G09G 3/006 |

FOREIGN PATENT DOCUMENTS

| | | |
|---|---|---|
| CN | 203191949 U | 9/2013 |
| CN | 103379723 A | 10/2013 |
| CN | 105632382 A | 6/2016 |
| CN | 106842735 A | 6/2017 |
| CN | 107463014 A | 12/2017 |
| CN | 109523943 A | 3/2019 |
| CN | 110133883 A | 8/2019 |
| CN | 110391192 A | 10/2019 |
| CN | 209593881 U | 11/2019 |
| CN | 110675737 A | 1/2020 |
| CN | 110930866 A | 3/2020 |
| CN | 110967880 A | 4/2020 |
| CN | 210245029 U | 4/2020 |
| CN | 111524450 A | 8/2020 |

OTHER PUBLICATIONS

Written Opinion of the International Search Authority in International application No. PCT/CN2020/138475, dated Sep. 6, 2021.
1st Chinese Office Action issued in corresponding Chinese Patent Application No. 202011391391.6 dated Jul. 13, 2021, pp. 1-12.
2nd Chinese Office Action issued in corresponding Chinese Patent Application No. 202011391391.6 dated Nov. 26, 2021, pp. 1-16.
3rd Chinese Office Action issued in corresponding Chinese Patent Application No. 202011391391.6 dated Jan. 28, 2022, pp. 1-15.

* cited by examiner

| disposing a chip-on-film between a display panel and a circuit board. The chip-on-film electrically connected to the display panel and the circuit board. The chip-on-film comprises a plurality of pins. The plurality of pins comprise a plurality of conducting pins and test pins. The circuit board comprises a first detection part and a second detection part | ← S21 |

↓

| electrically connecting any one of the conduction pins and the test pins by test wires | ← S22 |

↓

| electrically connecting the first detection part and at least one conducting pin. Electrically connecting the second detection part to the test pins | ← S23 |

↓

| detecting the first detection part and the second detection part, to detect the impedance | ← S24 |

FIG. 6

DISPLAY DEVICE AND DETECTION METHOD FOR IMPEDANCE OF DISPLAY DEVICE

RELATED APPLICATIONS

This application is a Notional Phase of PCT Patent Application No. PCT/CN2020/138475 having international filing date of Dec. 23, 2020, which claims the benefit of priority of Chinese Patent Application No. 202011391391.6 filed on Dec. 2, 2020. The contents of the above applications are all incorporated by reference as if fully set forth herein in their entirety.

BACKGROUND OF INVENTION

Field of Invention

The present invention relates to a field of display technology, and in particular to a display device and a detection method for impedance of the display device.

Description of Prior Art

During fabrication of display devices, a connection between flexible printed circuit (FPC) and chip-on-film (or chip on flex, COF) and a connection between the COF and a display panel are achieved by a bonding process. However, impedance exists between the FPC and the COF and between the COF and the display panel, so it is necessary to detect the impedance between the FPC and the COF and between the COF and the display panel. In the prior art, when testing an impedance of a display device, it is necessary to destroy a structure in the display device to detect the impedance. It will affect a display performance of the display device and reduce a display effect of the display device. Therefore, it is urgent to find a way to test the impedance without destroying the structure of the display device.

SUMMARY OF INVENTION

The present invention provides a display device and a detection method for impedance of the display device, to test and obtain the impedance of the display device without destroying the structure of the display device.

The present invention provides a display device, comprising:
  a display panel;
  a circuit board comprising a first detection part and a second detection part; and
  a chip-on-film electrically connected to the display panel and the circuit board;
  wherein, the chip-on-film comprises a plurality of pins, the plurality of pins comprise a plurality of conducting pins and test pins, at least one conducting pin is electrically connected to the first detection part, the test pins are disposed on one side of the conducting pins, the test pins are electrically connected to the second detection part, the conducting pins electrically connected to the first detection part are connected to the test pins by test wires, the pins comprise a ground wire, the ground wire is disposed on one side of the plurality of pins, the ground wire is insulated from the pins, and the ground wire is grounded.

In one exemplary embodiment, wherein the test wires comprise a first sub-test wire, the first sub-test wire is disposed on the chip-on-film, the test pins comprise a first sub-test pin, and the first sub-test wire is connected to one conducting pin and the first sub-test pin.

In one exemplary embodiment, wherein the test wires comprise a second sub-test wire, the second sub-test wire is disposed on the display panel, the test pins comprise a second sub-test pin, and the second sub-test wire is connected to an end part of one conducting pin and an end part of the second sub-test pin.

In one exemplary embodiment, wherein the pins comprise a wire, the wire is disposed on the other side of the plurality of pins, the wire is insulated from the pins, and the wire is grounded.

In one exemplary embodiment, wherein the pins comprise a wire, the wire is disposed on the other side of the plurality of pins, the wire is non-insulated from the pins, and the wire is grounded.

In one exemplary embodiment, wherein the first detection part comprises a first sub-detection part, the second detection part comprises a second sub-detection part, the conducting pins which are electrically connected to the first sub-test wire are connected to the first sub-detection part, and the first sub-test pin which is electrically connected to the first sub-test wire is connected to the second sub-detection part.

In one exemplary embodiment, wherein the first detection part comprises a third sub-detection part, the second detection part comprises a fourth sub-detection part, the conducting pins which are electrically connected to the second sub-test wire are connected to the third sub-detection part, and the second sub-test pin which is electrically connected to the second sub-test wire is connected to the fourth sub-detection part.

The present invention provides a display device, comprising:
  a display panel;
  a circuit board comprising a first detection part and a second detection part; and
  a chip-on-film electrically connected to the display panel and the circuit board;
  wherein, the chip-on-film comprises a plurality of pins, the plurality of pins comprise a plurality of conducting pins and test pins, at least one conducting pin is electrically connected to the first detection part, the test pins are disposed on one side of the conducting pins, the test pins are electrically connected to the second detection part, and the conducting pins electrically connected to the first detection part are connected to the test pins by test wires.

In one exemplary embodiment, wherein the test wires comprise a first sub-test wire, the first sub-test wire is disposed on the chip-on-film, the test pins comprise a first sub-test pin, and the first sub-test wire is connected to one conducting pin and the first sub-test pin.

In one exemplary embodiment, wherein the test wires comprise a second sub-test wire, the second sub-test wire is disposed on the display panel, and the test pins comprise a second sub-test pin, the second sub-test wire is connected to an end part of the conducting pin and an end part of the second sub-test pin.

In one exemplary embodiment, wherein the pins comprise a wire, the wire is disposed on the other side of the plurality of pins, the wire is insulated from the pins, and the wire is grounded.

In one exemplary embodiment, wherein the pins comprise a wire, the wire is disposed on the other side of the plurality of pins, the wire is non-insulated from the pins, and the wire is grounded.

In one exemplary embodiment, wherein the first detection part comprises a first sub-detection part, the second detection part comprises a second sub-detection part, the conducting pins which are electrically connected to the first sub-test wire are connected to the first sub-detection part, and the first sub-test pin which is electrically connected to the first sub-test wire is connected to the second sub-detection part.

In one exemplary embodiment, wherein the first detection part comprises a third sub-detection part, the second detection part comprises a fourth sub-detection part, the conducting pins which are electrically connected to the second sub-test wire are connected to the third sub-detection part, and the second sub-test pin which is electrically connected to the second sub-test wire is electrically connected to the fourth sub-detection part.

The present invention provides a detection method for impedance of the display device, comprising:

disposing a chip-on-film between a display panel and a circuit board, wherein the chip-on-film is electrically connected to the display panel and the circuit board, the chip-on-film comprises a plurality of pins, the plurality of pins comprise a plurality of conducting pins and test pins, and the circuit board comprises a first detection part and a second detection part;

electrically connecting any one of the conducting pins and the test pins by test wires;

electrically connecting the first detection part and at least one conducting pin, connecting the second detection part to the test pins; and detecting the first detection part and the second detection part, to detect the impedance.

In one exemplary embodiment, wherein the test wires comprise a first sub-test wire, and the test pins comprise a first sub-test pin;

the step of electrically connecting any one of the conducting pins and the test pins by the test wires, comprises:

disposing the first sub-test wire on the chip-on-film, and connecting one end part of the first sub-test wire to the first sub-test pin, and connecting the other end part of the first sub-test wire to any one of the conducting pins.

In one exemplary embodiment, wherein the first detection part comprises a first sub-detection part, and the second detection part comprises a second sub-detection part;

the step of detecting the first detection part and the second detection part, to detect the impedance, comprises:

disposing the first sub-detection part and the second sub-detection part on the circuit board, connecting the first sub-detection part to the conducting pins, and connecting the second sub-detection part to the first sub-test pin; and correspondingly connecting two detection terminals of the detecting device to the first sub-detection part and the second sub-detection part, to detect an impedance of the bonding region of the circuit board.

In one exemplary embodiment, wherein the test wires comprise a second sub-test wire, and the test pins comprise a second sub-test pin;

the step of electrically connecting any one of the conducting pins and the test pins by the test wires, comprises:

disposing the second sub-test wire on the display panel, and connecting one end part of the second sub-test wire to the end part of the conducting pins, and connecting the other end part of the second sub-test wire to the end part of the second sub-test pin.

In one exemplary embodiment, wherein the first detection part comprises a third sub-detection part, and the second detection part comprises a fourth sub-detection part;

the step of detecting the first detection part and the second detection part, to detect the impedance, comprises:

disposing the third sub-detection part and the fourth sub-detection part on the circuit board, connecting the third sub-detection part to the conducting pins, and connecting the fourth sub-detection part to the second sub-test pin;

correspondingly connecting two detection terminals of the detecting device to the third sub-detection part and the fourth sub-detection part, to detect the total impedance of the bonding region of the circuit board and the bonding region of the display panel; and according to the impedance of the bonding region of the circuit board and the total impedance, obtaining an impedance of the bonding region of the display panel.

In one exemplary embodiment, wherein the pins comprise a ground wire, the ground wire is disposed on one side of the plurality of pins, the ground wire is insulated from the pins, and the ground wire is grounded.

In the detection method for impedance of the display device provided by the present invention, the pins comprise a ground wire. The ground wire is disposed on one side of the pins, the ground wire is insulated from the pins, and the ground wire is grounded. The present invention provides a display device and a detection method for impedance of the display device by disposing test wires in the display device and electrically connecting the first detection part and the test pins through the test wires, and the test pins are electrically connected to the second detection part to detect the first detection part and the second detection part. This allows the impedance of the display device to be obtained without destroying the structure of the display device, thereby ensuring the display performance of the display device.

BRIEF DESCRIPTION OF DRAWINGS

The technical scheme and other beneficial effects of the present invention will be obvious through the detailed description of the specific exemplary embodiment mode of the invention in combination with the drawings.

DETAILED DESCRIPTION OF PREFERRED EMBODIMENTS

The technical solutions in the embodiments of the present invention will be clearly and completely described below in conjunction with the accompanying drawings in the present invention. Obviously, the described embodiments are only a part of the embodiments of the present invention, rather than all the embodiments. Based on the embodiments of the present invention, all other embodiments obtained by those skilled in the art without creative work shall fall within the protection scope of the present invention.

Figure 1:
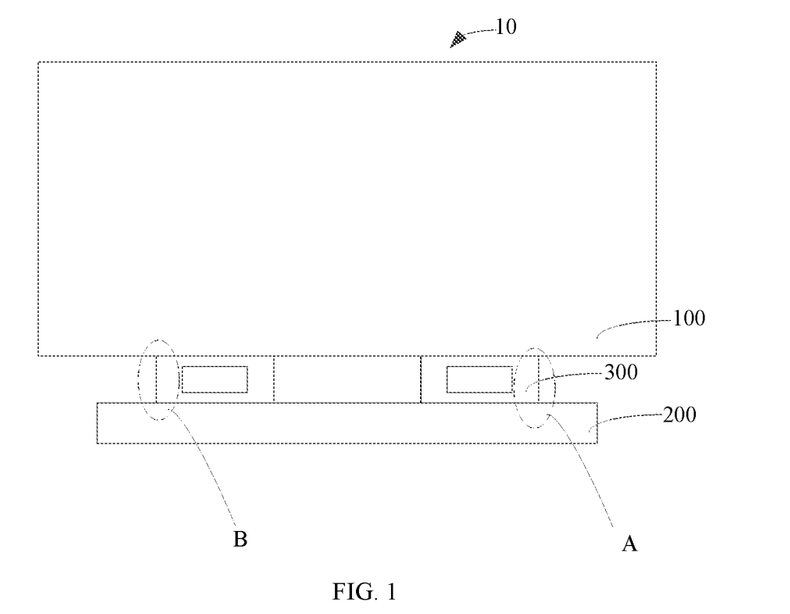
FIG. 1 is a top view structural diagram of a display device provided by an embodiment of the present invention.
Figure 2:
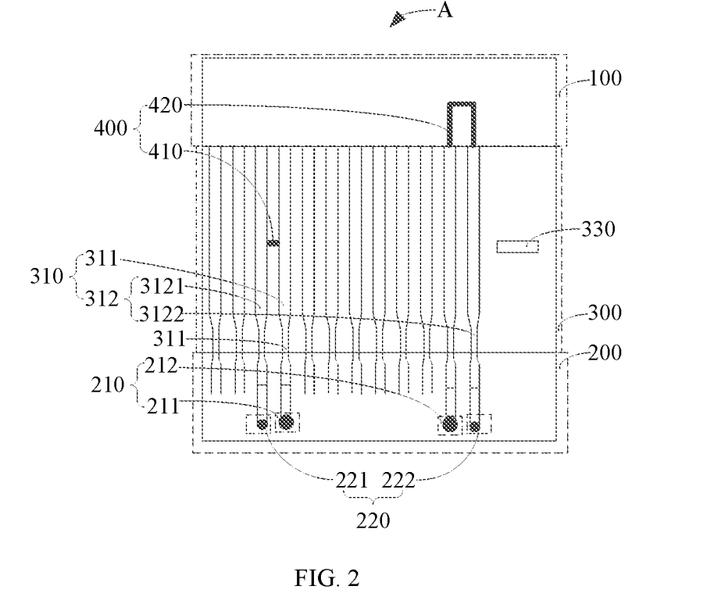
FIG. 2 is a structural diagram at A in FIG. 1.

Please refer to FIG. 1 and FIG. 2. FIG. 1 is a top view structural diagram of a display device provided by an embodiment of the present invention. FIG. 2 is a structural diagram at A in FIG. 1. The present invention provides a display device 10. The display device 10 comprises a display panel 100, a circuit board 200, and a chip-on-film 300. The details are as follows:

The circuit board 200 comprises a first detection part 210 and a second detection part 220.

The chip-on-film 300 is electrically connected to the display panel 100 and the circuit board 200.

Wherein, the chip-on-film 300 comprises a plurality of pins 310. The plurality of pins 310 comprise a plurality of conducting pins 311 and test pins 312. At least one conducting pin 311 is electrically connected to the first detection part 210. In this embodiment, a conducting pin 311 is electrically connected to the first detection part 210. The test pins 312 are disposed on one side of the conducting pins 311. The test pins 312 are electrically connected to the second detection part 220. The conducting pins 311 electrically connected to the first detection part 210 are connected to the test pins 312 by test wires 400.

Specifically, the first detection part 210 comprises a first sub-detection part 211. The second detection part 220 comprises a second sub-detection part 221. The test wires 400 comprise a first sub-test wire 410. The first sub-test wire 410 is disposed on the chip-on-film 200. The test pins 312 comprise a first sub-test pin 3121. The first sub-test wire 410 is connected to a conducting pin 311 and the first sub-test pin 3121. The first sub-test pin 3121 can electrically connect to the conducting pins 311 which are adjacent to the first sub-test wire 410 by first sub-test wire 410, or the first sub-test pin 3121 can electrically connect to the conducting pins 311 which are away from the first sub-test pin 3121 by the first sub-test wire 410, and no restrictions are made here. In this embodiment, the first sub-test pin 3121 being electrically connected to the conducting pins 311 adjacent to the first sub-test wire 410 by the first sub-test wire 410 is described as an example.

Then, the conducting pins 311 electrically connected to the first sub-test wire 410 are connected to the first sub-detection part 211. The first sub-test pin 3121 electrically connected to the first sub-test wire 410 is connected to the second sub-detection part 221.

Figure 3:
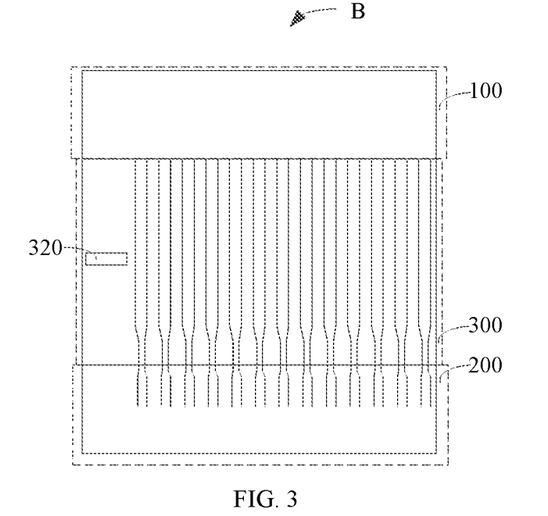
FIG. 3 is a structural diagram at B in FIG. 1.

In one embodiment, please refer to FIG. 3, FIG. 3 is a structural diagram at B in FIG. 1. The pins 310 comprise a wire 320 and a ground wire 330. The wire 320 is disposed on one side of the plurality of pins 310. The ground wire 330 is disposed on the other side of the plurality of pins 310. The wire 320 and the ground wire 330 are insulated from the pins 310. The wire 320 and the ground wire 330 are grounded. Specifically, the wire 320 is disposed on one side of the first pin 310 on the chip-on-film 300. The ground wire 330 is disposed on one side of the last pin 310 on the chip-on-film 300.

In another embodiment, the wire 320 and the ground wire 330 need not be both insulated from the pins 310, that is to say, any one of the wire 320 and the ground wire 330 can be insulated from the pins 310.

In present invention, the wire and the ground wire are disconnected from the pins, that is to say, the wire and the ground wire are insulated from the pin, avoiding the connection of the wire and the ground wire to four short pins on the chip-on-film. The four short pins are grounded, thus, the grounding of the pins is avoided, the abnormal display of the display device is avoided, and the display performance of the display device is guaranteed.

In present invention, by disposing a first sub-test wire on the chip-on-film, the first sub-test pin is short circuited with the conducting pins, and the first sub-test pin is connected to the second sub-detection part, and the conducting pins are connected to the first sub detection part, thus forming an impedance circuit for detecting the bonding region of the circuit board, and then the impedance of the bonding region of the circuit board can be detected. The structure is simple, and without destroying the structure in the display device, the impedance of the bonding region of the circuit board can be detected to ensure the display performance of the display device.

In another embodiment, the first detection part 210 comprises a third sub-detection part 212. The second detection part 220 comprises a fourth sub-detection part 222. The test wires 400 comprise a second sub-test wire 420, and the second sub-test wire 420 is disposed on the display panel 100.

Next, the test pins 312 comprise a second sub-test pin 3122, and the second sub-test wire 420 is connected to an end part of the conducting pin 311 and an end part of the second sub-test pin 3122. That is to say, the second sub-test wire 3122 is disposed on the display panel 100. The conducting pins 311 which are electrically connected to the second sub-test wire 420 are connected to the third sub-detection part 212. The second sub-test pin 3122 which is electrically connected to the second sub-test wire 420 is electrically connected to the fourth sub-detection part 222.

In present invention, the second sub-test wire is connected to the end of the second sub-test pin and the end of the conducting pins, and the second sub-test pin is connected to the fourth sub-detection part and the conducting pins are connected to the third sub-detection part, forming a line to detect the total impedance of the bonding region of the circuit board and the bonding region of the display panel. Finally, according to the total impedance of the bonding region of the circuit board and the bonding region of the display panel and the impedance of the bonding region of the circuit board, the impedance of the bonding region of the display panel is obtained.

Figure 4:
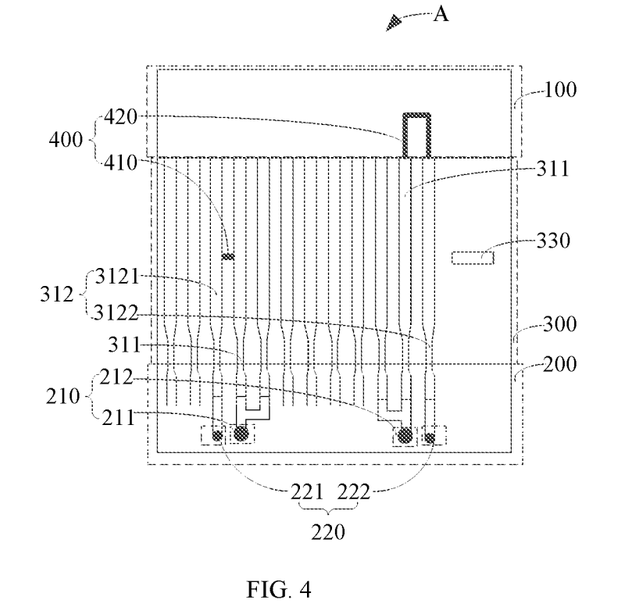
FIG. 4 is another structural diagram at A in FIG. 1.

Please refer to FIG. 4, FIG. 4 is another structural diagram at A in FIG. 1. It should be noted that the differences between FIG. 4 and FIG. 2 are as follows:

Two of the conducting pins 311 are electrically connected to the first detection part 210, further improving the detection accuracy of impedance.

Figure 5:
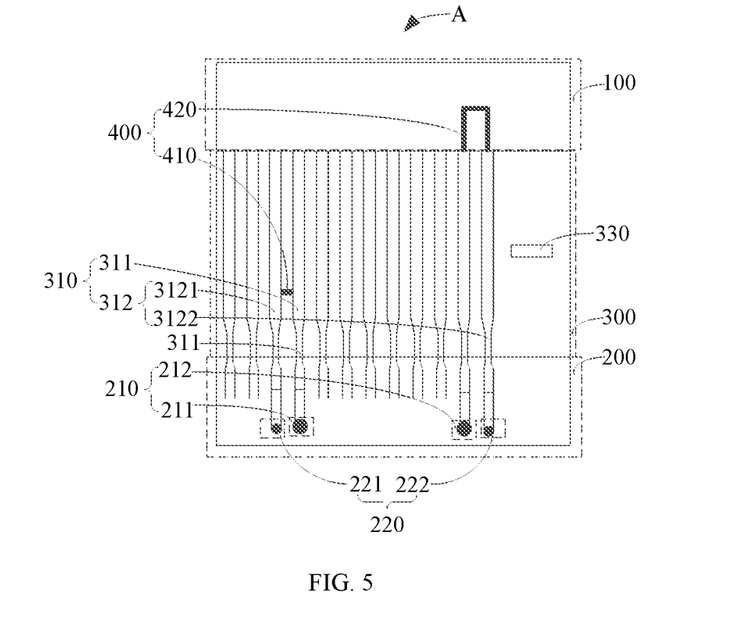
FIG. 5 is yet another structural diagram at A in FIG. 1.

Please refer to FIG. 5. FIG. 5 is yet another structural diagram at A in FIG. 1. It should be noted that the differences between FIG. 5 and FIG. 2 are as follows:

The first sub-test wire 410 is disposed on the side near the circuit board 200, further improving the detection accuracy of impedance.

Figure 6:
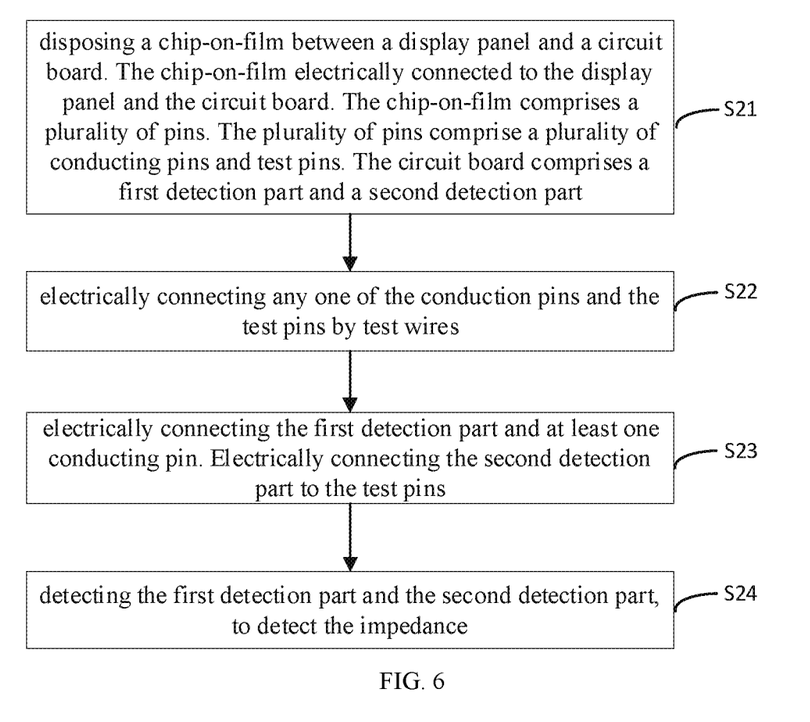
FIG. 6 is a flow chart of a preparation method of the display device provided by an embodiment of the present invention.

Please refer to FIG. 2 and FIG. 6, FIG. 2 is a top view structural diagram of the display device provided by the embodiment of the present invention. FIG. 6 is a flow chart of a preparation method of the display device provided by the embodiment of the present invention. The present invention also provides a detection method for the impedance of the display device 10, and the detection method is as follows:

Step S21, disposing a chip-on-film 300 between a display panel 100 and a circuit board 300. The chip-on-film 300 is electrically connected to the display panel 100 and the circuit board 200. The chip-on-film 300 comprises a plurality of pins 310. The plurality of pins 310 comprise a plurality of conducting pins 311 and test pins 312. The circuit board 200 comprises a first detection part 210 and a second detection part 220.

Specifically, the first detection part 210 comprises a first sub-detection part 211 and a third sub-detection part 212, and the second detection part 220 comprises a second sub-detection part 221 and a fourth sub-detection part 222.

Step S22, electrically connecting any one of the conducting pins 311 and the test pins 312 by test wires 400.

Specifically, the test wires 400 comprise a first sub-test wire 410 and a second sub-test wire 420. The test pins 312 comprise a first sub-test pin 3121 and a second sub-test pin 3122.

Then, disposing the first sub-test wire 410 on the chip-on-film 300, and connecting one end part of the first sub-test wire 410 to the first sub-test pin 3121, and connecting the other end part of the first sub-test wire 410 to any one of the conducting pins 311.

Then, disposing the second sub-test wire 420 on the display panel 100, and connecting one end part of the second sub-test wire 420 to the end part of the conducting pins 311, and connecting the other end part of the second sub-test wire 420 to the end part of the second sub-test pin 3122.

Step S23, electrically connecting the first detection part 210 and at least one conducting pin 311, and connecting the second detection part 220 to the test pins 312.

Step S24, detecting the first detection part 210 and the second detection part 220 to detect the impedance.

Specifically, disposing the first sub-detection part 211 and the second sub-detection part 221 on the circuit board 200, connecting the first sub-detection part 211 to the conducting pins 311, and connecting the second sub-detection part 221 to the first sub-test pin 3121.

Then, correspondingly connecting two detection terminals of the detecting device to the first sub-detection part 211 and the second sub-detection part 221 to detect the impedance of the bonding region of the circuit board 200. The detection device can be a multimeter, but is not limited to this. That is to say, when the two detection ends of the multimeter are respectively connected to the first sub-detection part 211 and the second sub-detection part 221, the multimeter, the second sub-detection part 221, the first sub-test pin 3121, the first sub-test wire 410, the conducting pin 311, and the first sub detection part 211 form an impedance line for detecting the bonding region of the circuit board 200, and the impedance of the bonding region of the circuit board 200 is detected.

Then, disposing the third sub-detection part 212 and the fourth sub-detection part 222 on the circuit board 200, connecting the third sub-detection part 212 to the conducting pins 311, and connecting the fourth sub-detection part 222 to the second sub-test pin 3122.

Then, correspondingly connecting two detection terminals of the detecting device to the third sub-detection part 212 and the fourth sub-detection part 222 to detect the total impedance of the bonding region of the circuit board 200 and the bonding region of the display panel 100.

According to the impedance of the bonding region of the circuit board 200 and the total impedance of the bonding region of the circuit board 200 and the bonding region of the display panel 100, the impedance of the bonding region of the display panel 100 is obtained. That is to say, after detecting the impedance of the bonding region of the circuit board 200, the two detection terminals of the multimeter are respectively connected to the third sub-detection part 212 and the fourth sub-detection part 222; the multimeter, the third sub-detection part 212, the conducting pins 311, the second sub-test wire 420, the third sub-test pin 3122, and the fourth sub-detection part 222 form a circuit for detecting the total impedance of the bonding region of the circuit board 200 and the display panel 100, and the total impedance of the bonding region of the circuit board 200 and the display panel 100 is detected.

In present invention, by disposing the first sub-test wire on the chip-on-film and disposing the second sub-test wire on the display panel, the first sub-test pin is connected to the conducting pin, the first sub-test pin is connected to the second sub-detection part, and the conducting pin is connected to the first detection part. The multimeter is connected to the first sub-detection part and the second sub-detection part to detect the impedance of the bonding region of the circuit board, that is, without damaging the structure of the display device, the impedance of the area of the circuit board is detected, which ensures the normal display of the display device. By disposing the second sub-test wire on the display panel, the second sub-test wire connects the conducting pin to the second sub-test pin, the conducting pins are connected to the third sub-detection part, and the second sub-test pin is connected to the fourth sub-detection part. The multimeter is connected to the third sub-detection part and the fourth sub-detection part. The total impedance of the bonding region of the circuit board and the bonding region of the display panel can be obtained. The difference between the impedance of the bonding region of the circuit board and the total impedance of the bonding region of the display panel and the bonding region of the circuit board is the impedance of the bonding region of the display panel. This method is simple and easy to operate, and it does not damage the structure of the display device, so as to ensure that the display device can display normally.

The present invention provides a display device and a detection method for impedance of the display device by disposing test wires in the display device and electrically connecting the first detection part and the test pins through the test wires, and the test pins are electrically connected to the second detection part to detect the first detection part and the second detection part. This allows the impedance of the display device to be obtained without destroying the structure of the display device, thereby ensuring the display performance of the display device.

The above provides a detailed introduction to a display device and a detection method for impedance of the display device provided by the present invention. Specific examples are used in this article to illustrate the principle and implementation of the present invention. The description of the above embodiments is only used to help understand the present invention. At the same time, for those skilled in the art, according to the idea of the present invention, there will be changes in the specific implementation and the scope of application. In summary, the content of this specification should not be construed as a limitation to the present invention.

What is claimed is:
1. A display device, comprising:
  a display panel;
  a circuit board comprising a first detection part and a second detection part; and
  a chip-on-film electrically connected to the display panel and the circuit board;
  wherein the chip-on-film comprises a plurality of pins, the plurality of pins comprise a plurality of conducting pins and test pins, at least one conducting pin is electrically connected to the first detection part, the test pins are disposed on one side of the conducting pins, the test pins are electrically connected to the second detection part, the conducting pins electrically connected to the first detection part are connected to the test pins by test wires, the pins comprise a wire and a ground wire, the ground wire is disposed on one side of the plurality of pins, the wire is disposed on the other side of the plurality of pins, the ground wire is insulated from the pins, and the ground wire is grounded, the wire is non-insulated from the pins, and the wire is grounded;

wherein the test wires comprise a first sub-test wire, the first sub-test wire is disposed on the chip-on-film, the test pins comprise a first sub-test pin, and the first sub-test wire is connected to one conducting pin and the first sub-test pin;

wherein the first sub-test pin is electrically connected to the conducting pins by the first sub-test wire, the conducting pins electrically connected to the first sub-test pin is disposed away from the first sub-test pin, the first sub-test wire is disposed on the side near the circuit board.

2. The display device according to claim 1, wherein the first detection part comprises a first sub-detection part, the second detection part comprises a second sub-detection part, the conducting pins which are electrically connected to the first sub-test wire are connected to the first sub-detection part, and the first sub-test pin which is electrically connected to the first sub-test wire is connected to the second sub-detection part.

3. The display device according to claim 1, wherein the test wires comprise a second sub-test wire, the second sub-test wire is disposed on the display panel, the test pins comprise a second sub-test pin, and the second sub-test wire is connected to an end part of one conducting pin and an end part of the second sub-test pin.

4. The display device according to claim 3, wherein the first detection part comprises a third sub-detection part, the second detection part comprises a fourth sub-detection part, the conducting pins which are electrically connected to the second sub-test wire are connected to the third sub-detection part, and the second sub-test pin which is electrically connected to the second sub-test wire is connected to the fourth sub-detection part.

5. A display device, comprising:
   a display panel;
   a circuit board comprising a first detection part and a second detection part; and
   a chip-on-film electrically connected to the display panel and the circuit board;
   wherein the chip-on-film comprises a plurality of pins, the plurality of pins comprise a plurality of conducting pins and test pins, at least one conducting pin is electrically connected to the first detection part, the test pins are disposed on one side of the conducting pins, the test pins are electrically connected to the second detection part, and the conducting pins electrically connected to the first detection part are connected to the test pins by test wires;
   wherein the test wires comprise a first sub-test wire, the first sub-test wire is disposed on the chip-on-film, the test pins comprise a first sub-test pin, and the first sub-test wire is connected to one conducting pin and the first sub-test pin;
   wherein the pins comprise a wire and a ground wire, the wire is disposed on one side of a first pin on the chip-on-film, the ground wire is disposed on one side of a last pin on the chip-on-film, the wire is insulated from the pins, and the wire is grounded;
   wherein the first sub-test pin is electrically connected to the conducting pins by the first sub-test wire, the conducting pins electrically connected to the first sub-test pin is disposed away from the first sub-test pin, the first sub-test wire is disposed on the side near the circuit board.

6. The display device according to claim 5, wherein the test wires comprise a second sub-test wire, the second sub-test wire is disposed on the display panel, the test pins comprise a second sub-test pin, and the second sub-test wire is connected to an end part of one conducting pin and an end part of the second sub-test pin.

7. The display device according to claim 5, wherein the first detection part comprises a first sub-detection part, the second detection part comprises a second sub-detection part, the conducting pins which are electrically connected to the first sub-test wire are connected to the first sub-detection part, and the first sub-test pin which is electrically connected to the first sub-test wire is connected to the second sub-detection part.

8. The display device according to claim 6, wherein the first detection part comprises a third sub-detection part, the second detection part comprises a fourth sub-detection part, the conducting pins which are electrically connected to the second sub-test wire are connected to the third sub-detection part, and the second sub-test pin which is electrically connected to the second sub-test wire is connected to the fourth sub-detection part.

9. A detection method for impedance of a display device, comprising:
   disposing a chip-on-film between a display panel and a circuit board, wherein the chip-on-film is electrically connected to the display panel and the circuit board, the chip-on-film comprises a plurality of pins, the plurality of pins comprise a plurality of conducting pins and test pins, and the circuit board comprises a first detection part and a second detection part;
   electrically connecting any one of the conducting pins and the test pins by test wires;
   electrically connecting the first detection part and at least one conducting pin, and electrically connecting the second detection part to the test pins; and
   detecting the first detection part and the second detection part to detect the impedance;
   wherein the test wires comprise a first sub-test wire, and the test pins comprise a first sub-test pin;
   the step of electrically connecting any one of the conducting pins and the test pins by the test wires comprises:
   disposing the first sub-test wire on the chip-on-film, and connecting one end part of the first sub-test wire to the first sub-test pin, and connecting the other end part of the first sub-test wire to any one of the conducting pins;
   wherein the pins comprise a wire and a ground wire, the ground wire is disposed on one side of the plurality of pins, the wire is disposed on the other side of the plurality of pins, the wire is insulated from the pins, and the wire is grounded, the ground wire is insulated from the pins, and the ground wire is grounded;
   wherein the first sub-test pin is electrically connected to the conducting pins by the first sub-test wire, the conducting pins electrically connected to the first sub-test pin is disposed away from the first sub-test pin, the first sub-test wire is disposed on the side near the circuit board.

10. The detection method for impedance of the display device according to claim 9, wherein the first detection part comprises a first sub-detection part, and the second detection part comprises a second sub-detection part;

the step of detecting the first detection part and the second detection part to detect the impedance comprises:

disposing the first sub-detection part and the second sub-detection part on the circuit board, connecting the first sub-detection part to the conducting pins, and connecting the second sub-detection part to the first sub-test pin; and correspondingly connecting two detection terminals of a detecting device to the first sub-detection part and the second sub-detection part to detect an impedance of a bonding region of the circuit board.

11. The detection method for impedance of the display device according to claim 10, wherein the test wires comprise a second sub-test wire, and the test pins comprise a second sub-test pin;

the step of electrically connecting any one of the conducting pins and the test pins by the test wires comprises:

disposing the second sub-test wire on the display panel, and connecting one end part of the second sub-test wire to an end part of the conducting pins, and connecting the other end part of the second sub-test wire to an end part of the second sub-test pin.

12. The detection method for impedance of the display device according to claim 11, wherein the first detection part comprises a third sub-detection part, and the second detection part comprises a fourth sub-detection part;

the step of detecting the first detection part and the second detection part to detect the impedance comprises:

disposing the third sub-detection part and the fourth sub-detection part on the circuit board, connecting the third sub-detection part to the conducting pins, and connecting the fourth sub-detection part to the second sub-test pin;

correspondingly connecting two detection terminals of the detecting device to the third sub-detection part and the fourth sub-detection part to detect a total impedance of a bonding region of the circuit board and a bonding region of the display panel; and according to the impedance of the bonding region of the circuit board and the total impedance, obtaining an impedance of the bonding region of the display panel.

* * * * *